(12) United States Patent
Chang

(10) Patent No.: US 7,176,730 B2
(45) Date of Patent: Feb. 13, 2007

(54) SYSTEM AND METHOD TO REDUCE GLITCH DISTURBANCE FOR PHASE/FREQUENCY DETECTING DEVICE

(75) Inventor: Chi-Ming Chang, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 10/742,805

(22) Filed: Dec. 23, 2003

(65) Prior Publication Data
US 2004/0135641 A1    Jul. 15, 2004

(30) Foreign Application Priority Data
Jan. 10, 2003    (TW) .............................. 92100576 A

(51) Int. Cl.
*H03L 7/06*    (2006.01)
*H03L 7/00*    (2006.01)

(52) U.S. Cl. .......................... 327/156; 327/34; 331/25

(58) Field of Classification Search .................. 331/17, 331/11, 25, 1 A, DIG. 2; 327/2, 3, 5, 7–10, 327/147–153, 156–159; 375/373–376
See application file for complete search history.

(56) References Cited

U.S. PATENT DOCUMENTS

| | | | | |
|---|---|---|---|---|
| 5,128,632 A | * | 7/1992 | Erhart et al. ................ | 331/1 A |
| 5,334,952 A | * | 8/1994 | Maddy et al. ............... | 331/1 A |
| 5,818,304 A | * | 10/1998 | Hogeboom ................... | 331/11 |
| 5,896,066 A | * | 4/1999 | Katayama et al. ............ | 331/17 |
| 6,310,521 B1 | * | 10/2001 | Dalmia ......................... | 331/11 |

* cited by examiner

*Primary Examiner*—Long Nguyen
*Assistant Examiner*—Ryan C. Jager
(74) *Attorney, Agent, or Firm*—Troxell Law Office, PLLC

(57) ABSTRACT

The invention system adjusts a phase/frequency detecting device in a phase locked loop. The phase/frequency detecting device compares a target clock signal generated from the phase locked loop with a predetermined reference clock signal, and outputs a set of control signals to further control the target clock signal to synchronize with the reference clock signal. A reset module counts the set of control signals and outputs a set of reset signals when a predetermined reset condition is met. A switch module counts the set of reset signals and switches the phase/frequency detecting device between a normal mode and a glitch protection mode when a predetermined switch condition is met. When the phase/frequency detecting device is under the glitch protection mode, and the predetermined reset condition set by the reset module is met, the reset module outputs the set of reset signals and resets the phase/frequency detecting device.

20 Claims, 11 Drawing Sheets

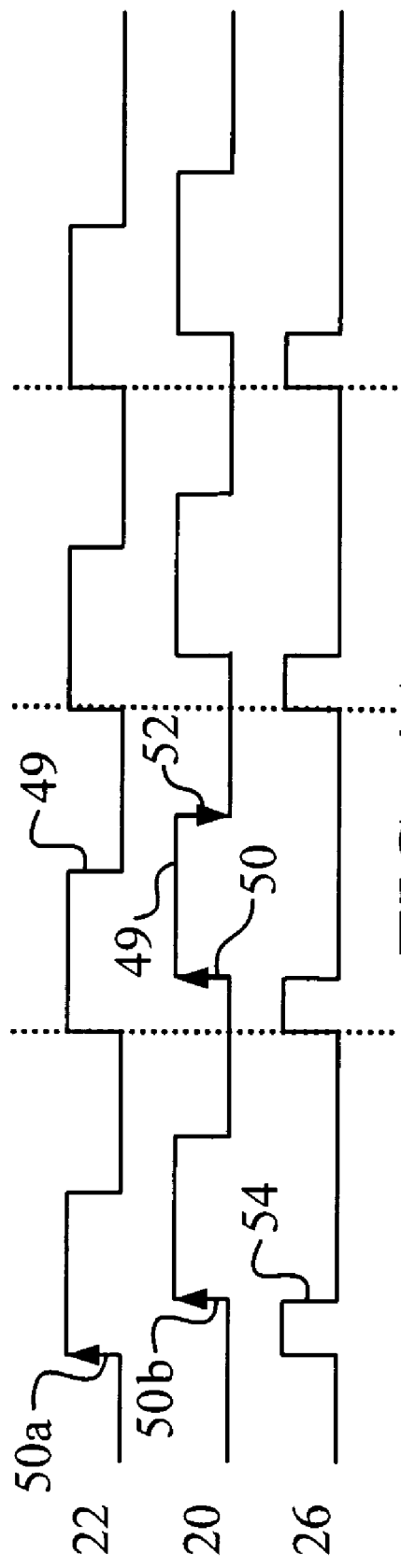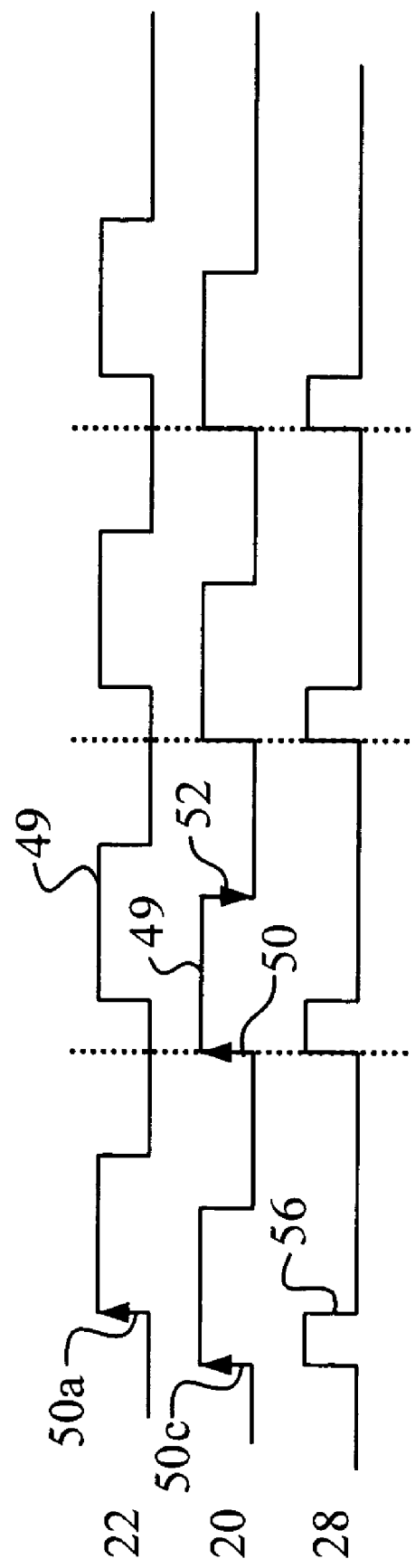

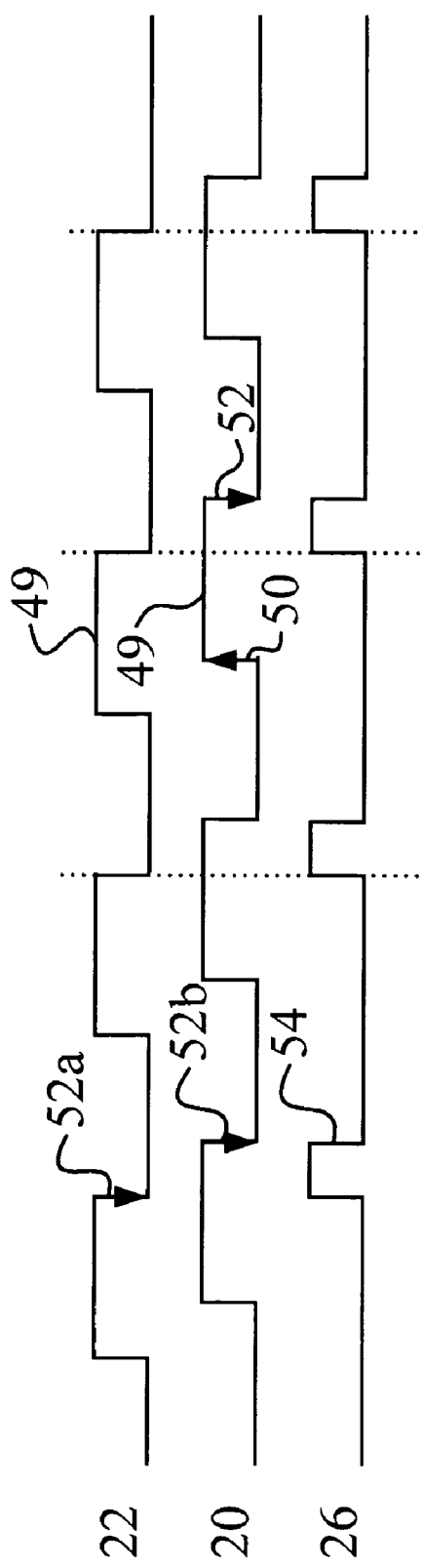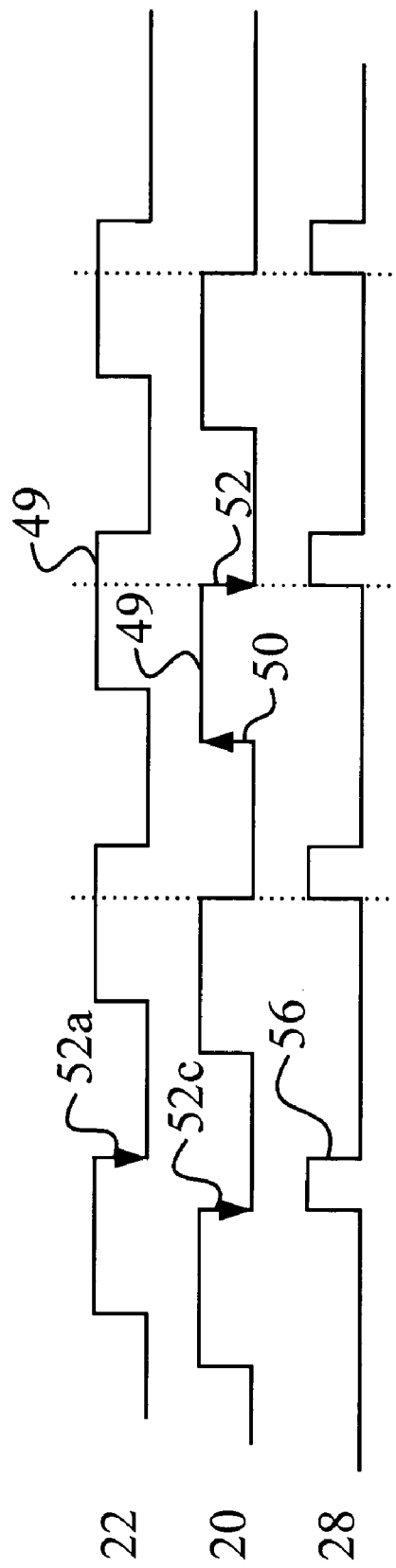

SYSTEM AND METHOD TO REDUCE GLITCH DISTURBANCE FOR PHASE/FREQUENCY DETECTING DEVICE

BACKGROUND OF THE INVENTION

1. Field of the Invention

The present invention relates to an adjustment system for adjusting a phase/frequency detecting device in a phase locked loop, and more particularly, the present invention relates to a phase/frequency detecting device and method that can reduce the glitch disturbance.

2. Description of the prior art

Referring to FIG. 1, FIG. 1 is a schematic diagram of a conventional phase locked loop 10. The conventional phase locked loop 10 comprises a phase/frequency detecting device 12, a charge pump 40, a voltage-controlled oscillator 42, and a divider 44. The conventional phase/frequency detecting device 12 has a pair of flip flops (not shown) and is used for comparing a target clock signal 20, which is generated from the phase locked loop 10, with a predetermined reference clock signal 22, and outputting a set of control signals 26, 28 to further control the target clock signal 20 so as to synchronize with the reference clock signal 22.

The charge pump 40 is used for receiving the set of control signals 26, 28 outputted from the phase/frequency detecting device 12, and outputting a control voltage 46. The voltage-controlled oscillator 42 is used for generating a corresponding data clock signal 48 according to the control voltage 46. The divider 44 is used for dividing the frequency of the data clock signal 48 by a predetermined divisor and then generating the target clock signal 20. By the above-mentioned procedures, the phase/frequency detecting device 12 continuously compares the target clock signal 20 with the reference clock signal 22 and continuously outputs the set of control signals 26, 28 for continuously generating the target clock signal 20 to synchronize with the reference clock signal 22.

Referring to FIG. 2, FIG. 2 is a time-sequence diagram of the phase locked loop shown in FIG. 1. In FIG. 2, the horizontal axis represents the time axis, and the vertical axis represents the signal amplitude. In the beginning, there is a phase difference P between the target clock signal 20 and the reference clock signal 22. When a glitch 16 occurs in the target clock signal 20 or the reference clock signal 22, the control signals 26, 28 outputted from the phase/frequency detecting device 12 are changed by the disturbance of the glitch 16; the disturbed control signals 26, 28 show that there is another phase difference Q between the target clock signal 20 and the reference clock signal 22. However, there is only one phase difference P between the target clock signal 20 and the reference clock signal 22. Thus, the phase/frequency detecting device 12 often misinterprets the phase difference between the target clock signal 20 and the reference clock signal 22 and outputs a set of disturbed control signals 26, 28. Through the above-mentioned procedures, this disturbed set of control signals 26, 28 further generates another corresponding target clock signal 20; therefore the original operation is greatly disturbed.

It is still impossible to fully forecast and prevent when, where, and how the glitch 16 is generated. On the other hand, the conventional phase locked loop 10 merely uses the phase/frequency detecting device 12 and the feedback control circuit 18 to control the target clock signal 20 for synchronizing with the reference clock signal 22. When a glitch 16 is generated, or when the phase difference between the target clock signal 20 and the reference clock signal 22 becomes larger, the phase/frequency detecting device 12 usually takes longer time to synchronize the target clock signal 20 and the reference clock signal 22.

Therefore, the objective of the present invention is to provide an adjustment system and the method for adjusting the phase/frequency detecting device 12, in order to solve the problem mentioned above.

SUMMARY OF THE INVENTION

Accordingly, the objective of the present invention is to provide an adjustment system and the method for adjusting a phase/frequency detecting device in the phase locked loop, in order to enhance the phase lock ability and the phase lock efficiency. The adjustment system of the present invention can correct the problem caused by the glitch in a very short time when the glitch occurs in the phase/frequency detecting device.

According to one preferred embodiment of the present invention, the present invention provides an adjustment system for adjusting a phase/frequency detecting device. The phase/frequency detecting device is used in a phase locked loop for comparing a target clock signal, which is generated from the phase locked loop, with a predetermined reference clock signal and outputting a set of control signals to further control the target clock signal so as to synchronize with the reference clock signal. The set of control signals includes a first control signal and a second control signal. The adjustment system includes a reset module and a switch module. The reset module further includes a first counter and a second counter. The first counter counts the width of a leading pulse in the first control signal based on a counter clock and generates a first reset signal when a first reset condition is met. The second counter counts the width of a lag pulse in the second control signal based on the counter clock and generates a second reset signal when a second reset condition is met. The reset module outputs the first reset signal and the second reset signal when a predetermined reset condition is met. The switch module is used for counting the first reset signal and the second reset signal outputted by the reset module and switching the phase/frequency detecting device between a normal mode and a glitch protection mode when a predetermined switch condition is met. When the phase/frequency detecting device is under the glitch protection mode, and the predetermined reset condition set by the reset module is met, the reset module resets the phase/frequency detecting device.

If a glitch is generated when the phase/frequency detecting device is under the glitch protection mode, the adjustment system of the present invention will reset the phase/frequency detecting device by the reset signal so as to reduce the glitch disturbance to the control signals and the feedback control circuit. Therefore, the adjustment system of the present invention overcomes the disadvantage of low operating efficiency of the phase/frequency detecting device when the phase locked loop is disturbed by the glitch, shortens the time for synchronizing the target clock signal and the reference clock signal, and increases the operating efficiency of the phase locked loop.

These and other objectives of the present invention will no doubt become obvious to those skilled in the art after reading the following detailed description of the preferred embodiment, which is illustrated in the various figures and drawings.

BRIEF DESCRIPTION OF THE APPENDED DRAWINGS

FIG. 4A and FIG. 4B are time-sequence diagrams of the target clock signal, the reference clock signal, and the control signals shown in FIG. 3.

FIG. 10A and FIG. 10B are time-sequence diagrams of the control signals according to another embodiment of the present invention.

DETAILED DESCRIPTION OF THE INVENTION

Figure 1:
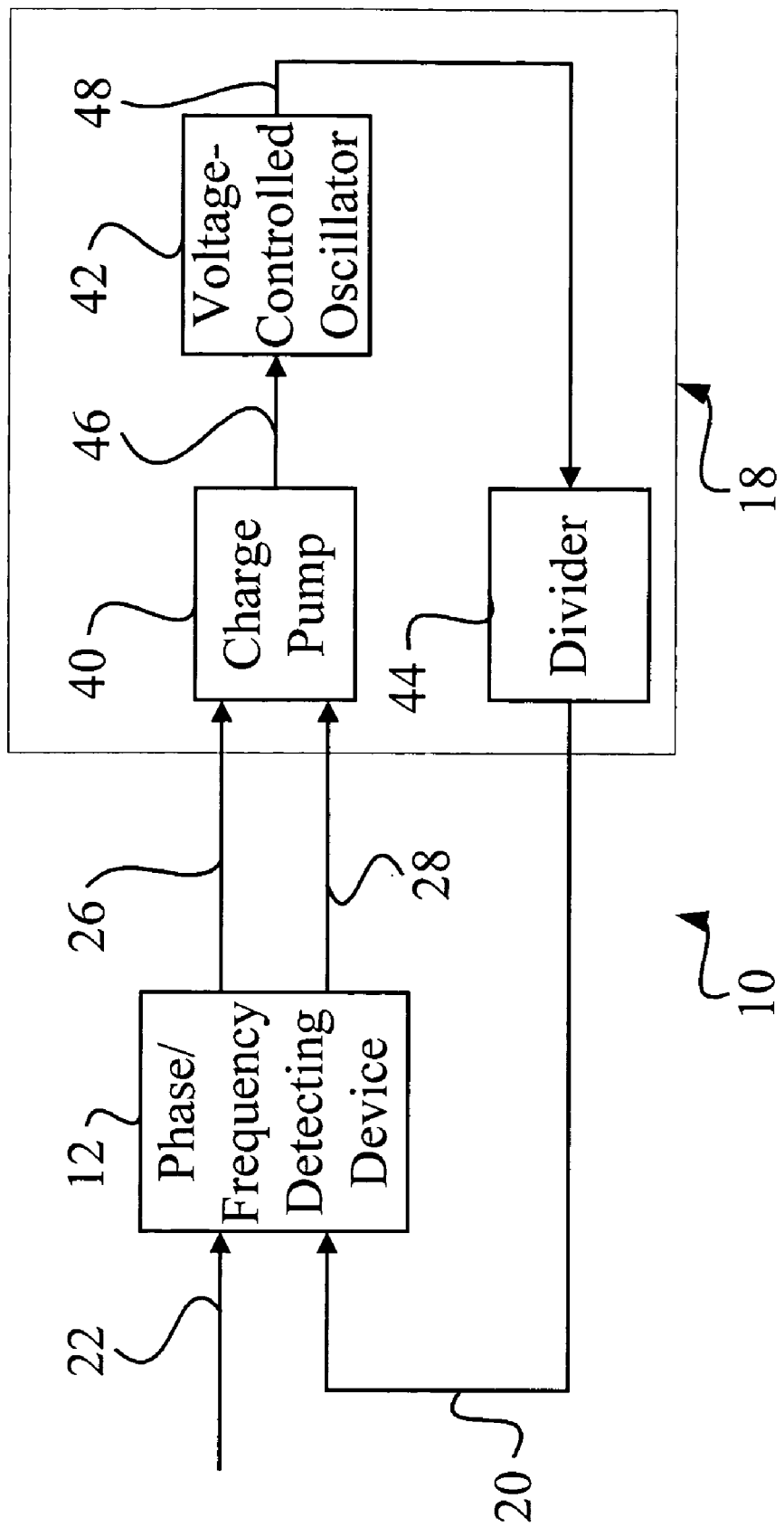
FIG. 1 is a schematic diagram of a conventional phase locked loop.
Figure 2:
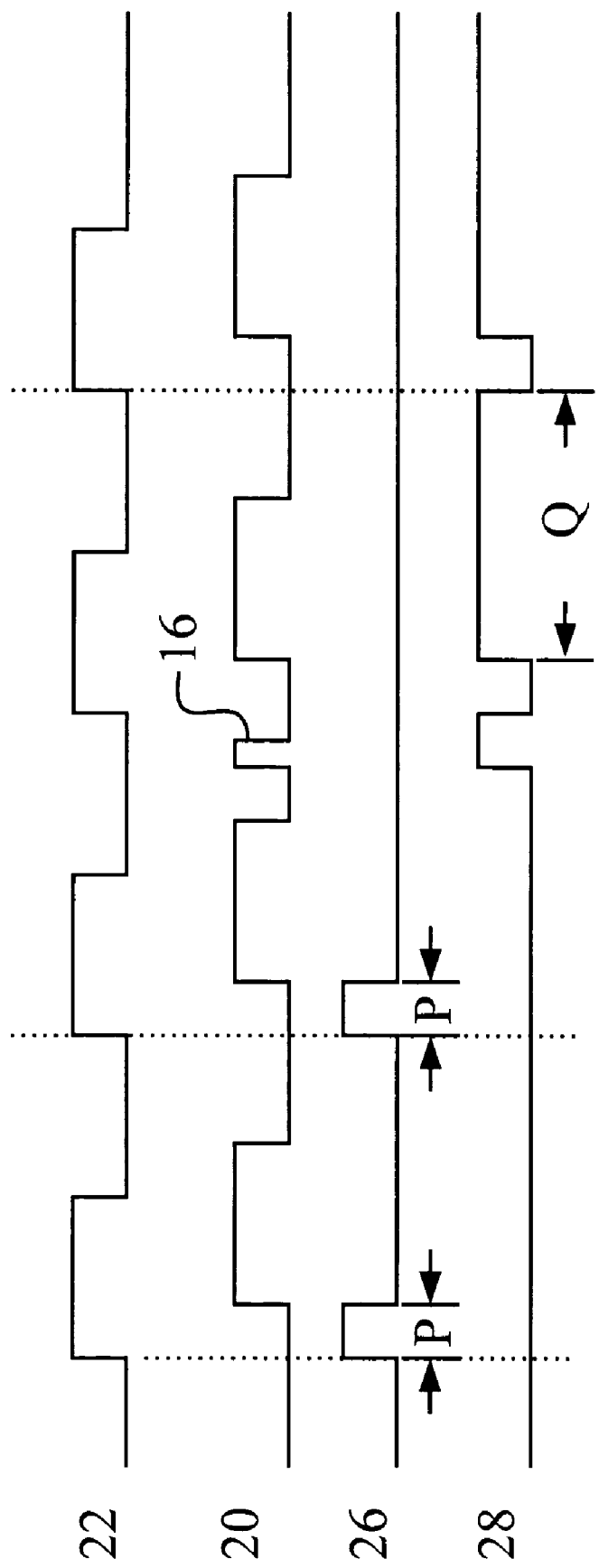
FIG. 2 is a time-sequence diagram of the phase locked loop shown in FIG. 1.
Figure 3:
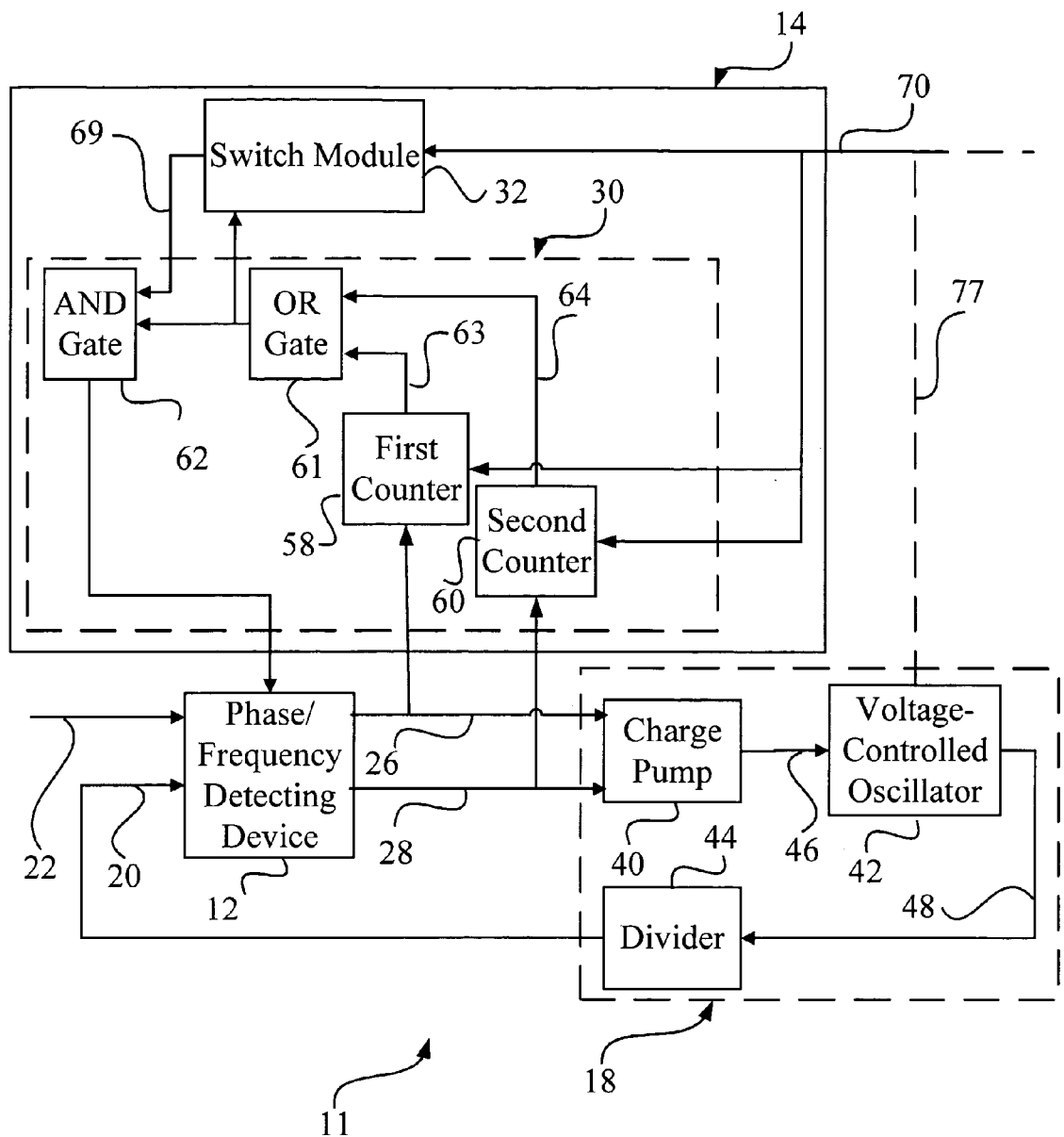
FIG. 3 is a schematic diagram of the adjustment system in a phase locked loop according to the present invention.

Referring to FIG. 3, FIG. 3 is a schematic diagram of an adjustment system 14 in a phase locked loop 11 according to the present invention. The present invention provides an adjustment system 14 for adjusting the phase/frequency detecting device 12 in the phase locked loop 11; the adjustment system 14 can raise the phase lock ability and increase the efficiency of the phase locked loop, especially when a glitch 16 occurs in the phase/frequency detecting device 12. Comparing to the conventional phase locked loop 10, the adjustment system 14 of the present invention can solve the problem caused by the glitch 16 in a very short time.

The adjustment system 14 is used for adjusting a phase/frequency detecting device 12. The phase locked loop 11 comprises a phase/frequency detecting device 12, an adjustment system 14, and a feedback control circuit 18.

The phase/frequency detecting device 12 compares a target clock signal 20 with a predetermined reference clock signal 22 and outputs a set of control signals 26, 28 to further control the target clock signal 20 so as to synchronize with the reference clock signal 22. The set of control signals 26, 28 comprises a first control signal 26 and a second control signal 28.

The adjustment system 14 comprises a reset module 30 and a switch module 32. The reset module 30 is used for counting the set of control signals 26, 28, and outputting a set of reset signals 63, 64 when a predetermined reset condition is met. The set of reset signals 63, 64 comprise a first reset signal 63 and a second reset signal 64.

The switch module 32 is used for counting the set of reset signals 63, 64, and switching the phase/frequency detecting device 12 between a normal mode and a glitch protection mode when a predetermined switch condition is met. When the switch module 32 is under the glitch protection mode, the switch module 32 outputs a glitch protection mode enable signal 69. When the switch module 32 is under the normal mode, the switch module 32 outputs nothing. When the phase/frequency detecting device 12 is under the glitch protection mode, and the predetermined reset condition set by the reset module 30 is met, the reset module 30 outputs the set of reset signals and then resets the phase/frequency detecting device 12.

Referring to FIG. 4A and FIG. 4B, FIG. 4A and FIG. 4B are time-sequence diagrams of the target clock signal 20, the reference clock signal 22, and the control signals 26, 28 shown in FIG. 3. The horizontal axis represents the time, and the vertical axis represents the signal amplitude. The target clock signal 20 and the reference clock signal 22 both comprise a plurality of square pulses 49, and each of the square pulses 49 comprises a positive edge 50 and a negative edge 52. When the positive edge 50a of the reference clock signal 22 is ahead of the positive edge 50b of the neighboring target clock signal 20, the first control signal 26 generates a leading pulse 54 (as shown in FIG. 4A) in response to the phase difference between the reference clock signal 22 and the target clock signal 20. Similarly, when the positive edge 50a of the reference clock signal 22 falls behind the positive edge 50c of the neighboring target clock signal 20, the second control signal 28 generates a lag pulse 56 (as shown in FIG. 4B) in response to the phase difference between the reference clock signal 22 and the target clock signal 20. The phase difference between the reference clock signal 22 and the target clock signal 20 is proportional to the width of the leading pulse 54 or the lag pulse 56. FIG. 4A represents that the positive edge 50a of the reference clock signal 22 is ahead of the positive edge 50b of the neighboring target clock signal 20, and FIG. 4B represents that the positive edge 50a of the reference clock signal 22 falls behind the positive edge 50c of the neighboring target clock signal 20.

As shown in FIG. 3, FIG. 4A, and FIG. 4B, the reset module 30 comprises a first counter 58, a second counter 60, an OR gate 61, and an AND gate 62. The first counter 58 counts the width of the leading pulse 54 in the first control signal 26 based on a counter clock 70. When the width of the leading pulse 54 exceeds a leading upper-limit value, the first counter 58 generates the first reset signal 63. The second counter 60 counts the width of the lag pulse 56 in the second control signal 28 based on the counter clock 70. When the width of the lag pulse 56 exceeds a lag upper-limit value, the second counter 60 generates the second reset signal 64. When one of the first reset signal 63 and the second reset signal 64 is inputted into the OR gate 61, the predetermined reset condition is met. The OR gate 61 outputs the first reset signal 63 or the second reset signal 64.

Figure 5:
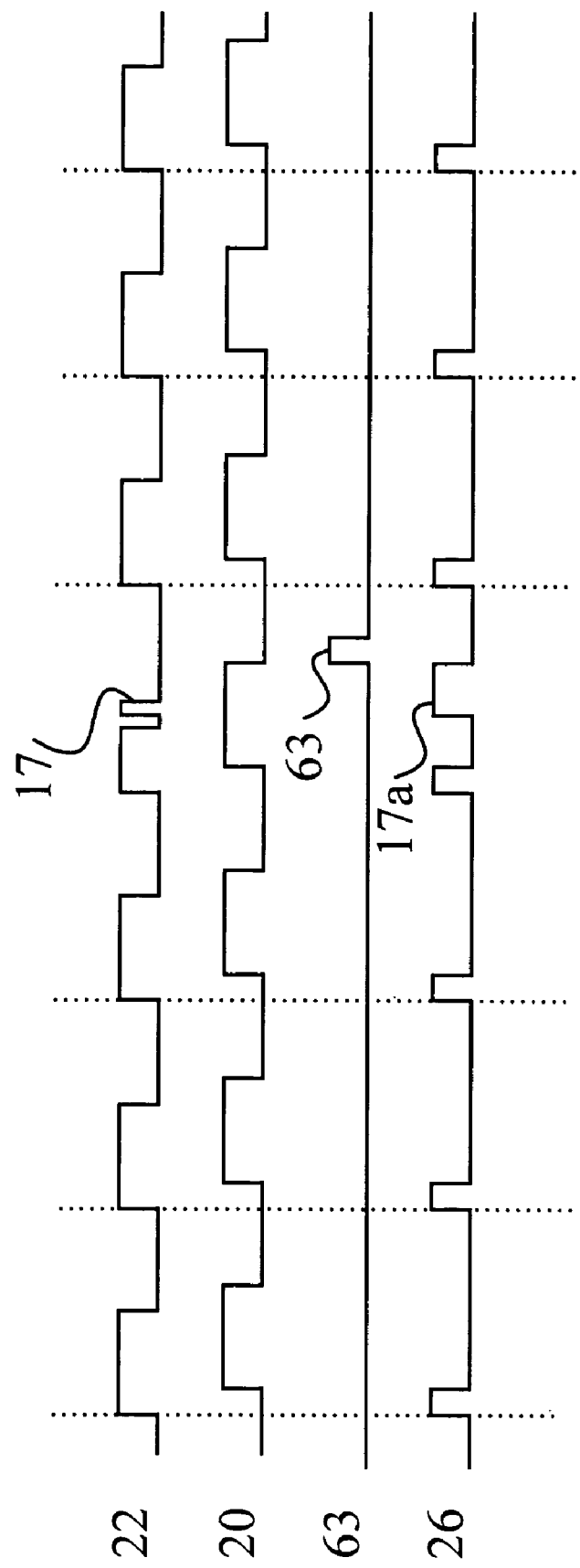
FIG. 5 is a time-sequence diagram when a glitch occurs in the reference clock signal shown in FIG. 3.
Figure 6:
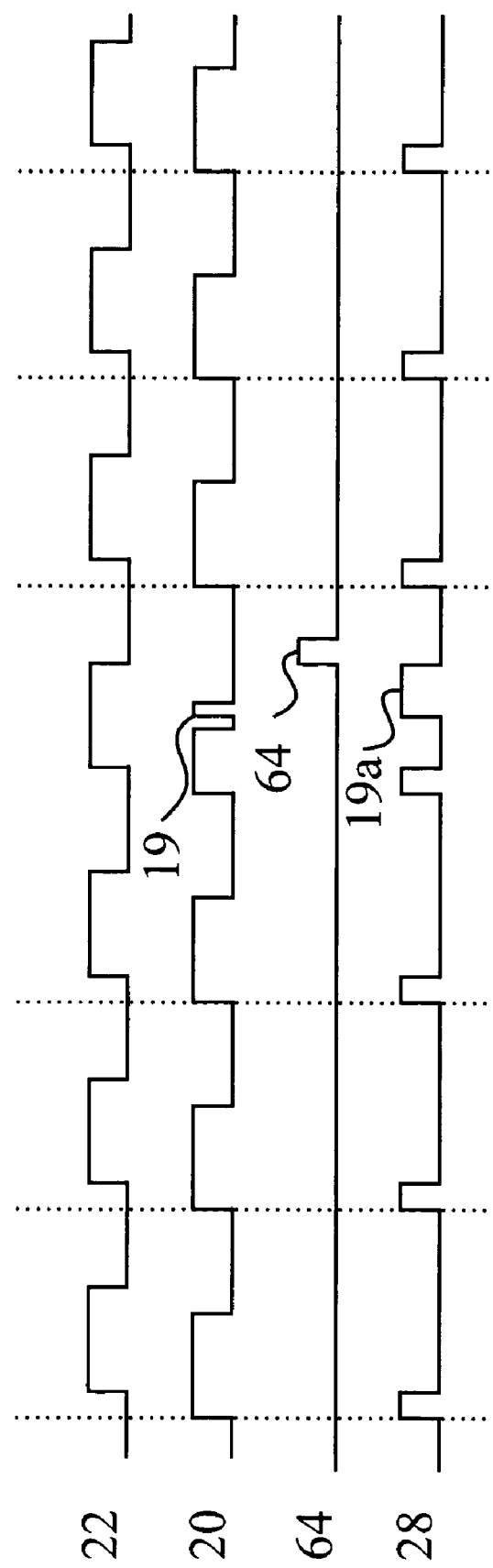
FIG. 6 is a time-sequence diagram when a glitch occurs in the target clock signal shown in FIG. 3.

Referring to FIG. 5 and FIG. 6, FIG. 5 is a time-sequence diagram when a glitch 17 occurs in the reference clock signal 22 shown in FIG. 3, and FIG. 6 is a time-sequence diagram when the glitch 19 occurs in the target clock signal 20 shown in FIG. 3. In these figures, the horizontal axis represents the time, and the vertical axis represents the signal amplitude. As shown in FIG. 5, when a glitch 17 occurs in the reference clock signal 22, the first control signal 26 generates an abnormal pulse 17a correspondingly. As shown in FIG. 6, when the glitch 19 occurs in the target clock signal 20, the second control signal 28 generates an abnormal pulse 19a correspondingly. Moreover, when the phase/frequency detecting device 12 is reset, the abnormal pulses 17a, 19a in the set of control signals 26, 28 are also minimized so as to reduce the glitch 17 and the glitch 19 from disturbing the set of control signals 26, 28.

The switch module 32 (shown in FIG. 3) is used for counting the set of reset signals 63, 64, and switching the phase/frequency detecting device 12 between a normal mode and a glitch protection mode when a predetermined switch condition is met. The predetermined switch conditions comprise a normal to glitch protection condition, and a glitch protection to normal condition.

Figure 7:
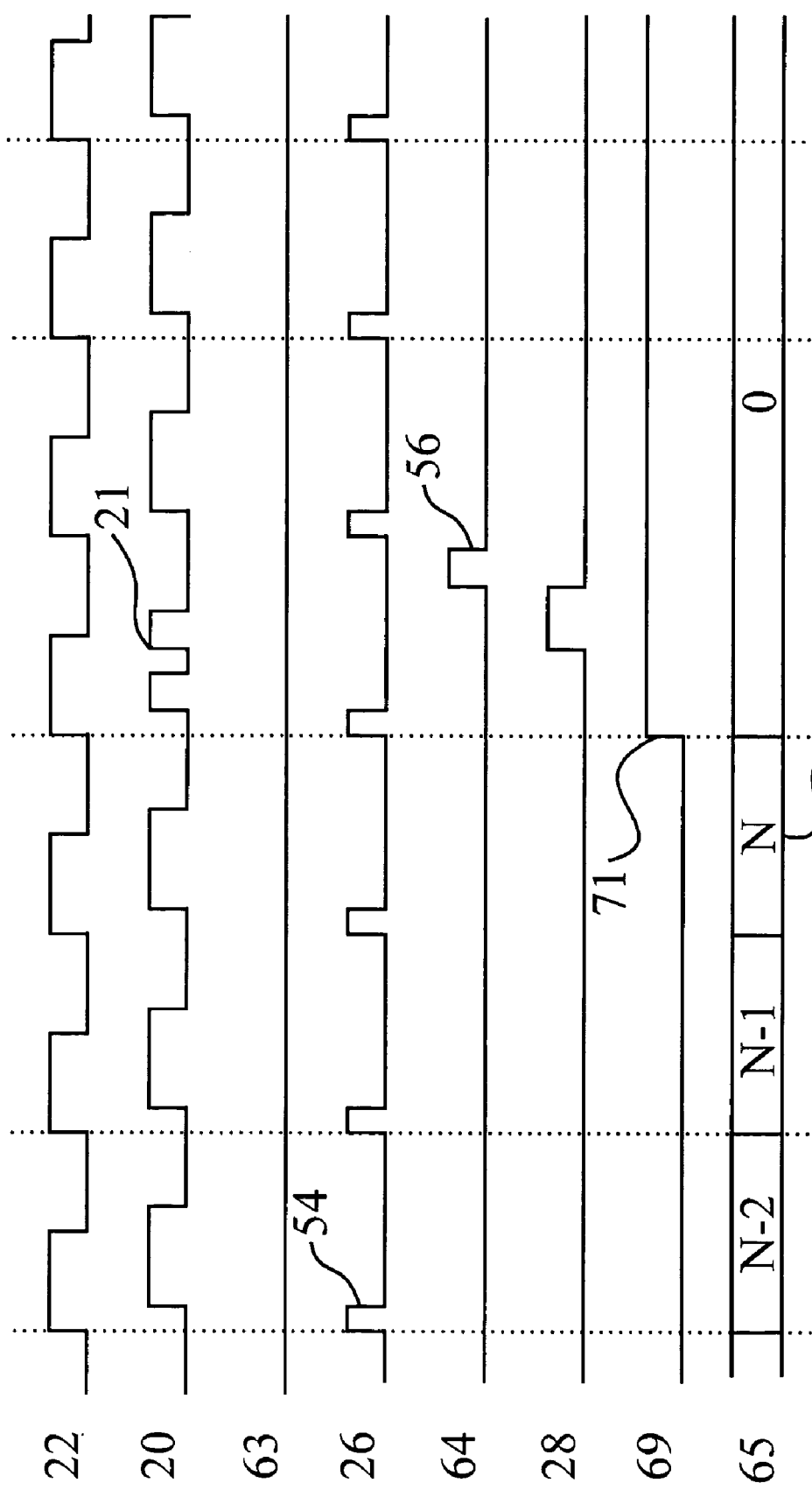
FIG. 7 is a time-sequence diagram of each related signals when the phase/frequency detecting device is switched from the normal mode to the glitch protection mode according to the present invention.

The normal to glitch protection condition is described as follows. Referring to FIG. 4A, FIG. 4B, and FIG. 7, FIG. 7 is a time-sequence diagram of each related signal when the phase/frequency detecting device 12 is switched from the normal mode to the glitch protection mode according to the present invention. If the first reset signal 63 or the second reset signal 64 is not generated during the whole process and when the total amount of the width of the leading pulse 54 in the first control signal 26 and the width of the lag pulse 56 in the second control signal 28 reaches a first switch value 67, then the normal to glitch protection condition is met. Therefore, the switch module 32 switches the phase/frequency detecting device 12 from the normal mode to the glitch protection mode. In FIG. 7, the left side of the switch point 71 represents that the phase/frequency detecting device 12 is under the normal mode, and the right side of the switch point 71 represents that the phase/frequency detecting device 12 is under the glitch protection mode; N represents the first switch value 67; N−2 and N−1 are count values 65 prior to N.

In other words, before the total count value 65 of the width of the leading pulse 54 in the first control signal 26 and the width of the lag pulse 56 in the second control signal 28 reaches the first switch value 67, the OR gate 61 does not output any reset signal 63, 64; that means the normal to glitch protection condition is met.

Referring to FIG. 3 and FIG. 7, when the phase/frequency detecting device 12 is under the normal mode, and the normal to glitch protection condition is met, the switch module 32 outputs the glitch protection mode enable signal 69 for switching the phase/frequency detecting device 12 from the normal mode to the glitch protection mode. When the glitch 21 is suddenly generated, the AND gate 62 of the reset module 30 receives the glitch protection mode enable signal 69 from the switch module 32 and the reset signals 63, 64 from the reset module 30; at this moment, the reset signals 63, 64 are outputted from the AND gate 62, and the phase/frequency detecting device 12 is reset. While resetting, the first control signal 26 and the second control signal 28 outputted from the phase/frequency detecting device 12 are forced to set back to zero, in order to quickly reduce the glitch disturbance and quickly synchronize the target clock signal 20 with the reference clock signal 22.

In other words, when the phase/frequency detecting device 12 is under the glitch protection mode, no matter the glitches 16, 17, 19, 21 are generated in the target clock signal 20 or the reference clock signal 22 or both, the control signals 26, 28 disturbed by the glitches 16, 17, 19, 21 are forced to be set back to zero because the reset signals 63, 64 reset the phase/frequency detecting device 12. Therefore, the influence on the control signals 26, 28 and the feedback control circuit 18 caused by the glitches 16, 17, 19, 21 is minimized, and the influence on the target clock signal 20 caused by the glitches 16, 17, 19, 21 is also minimized; thus, the target clock signal 20 and the reference clock signal 22 can be synchronized quickly.

Figure 8:
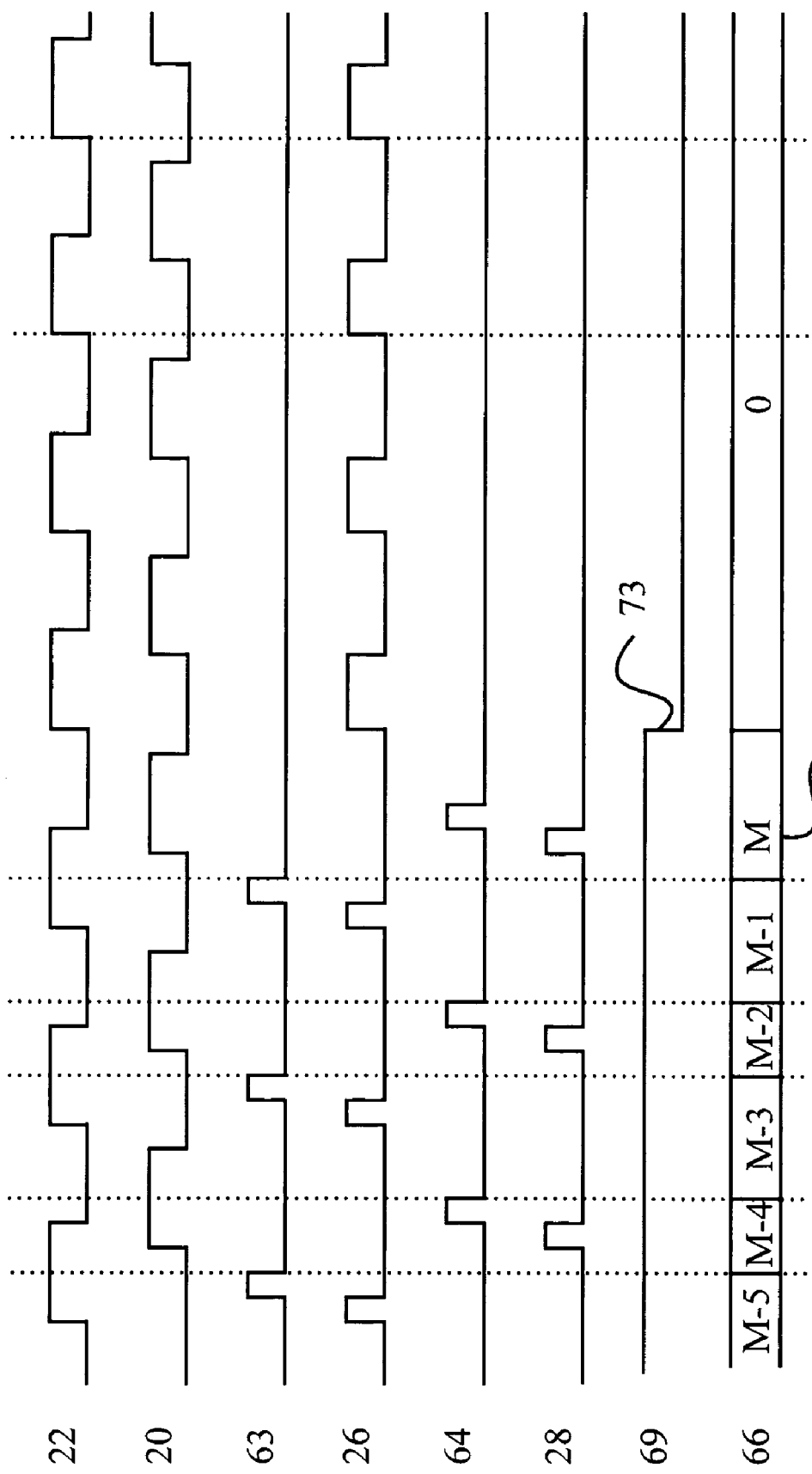
FIG. 8 is a time-sequence diagram of each related signals when the phase/frequency detecting device is switched from the glitch protection mode to the normal mode according to the present invention.

The switch from glitch protection to normal condition is described as follows. Referring to FIG. 8, FIG. 8 is a time-sequence diagram of each related signals when the phase/frequency detecting device is switched from the glitch protection mode to the normal mode according to the present invention. When the total count value 66 of the continuously generated first reset signal 63 and second reset signal 64 is counted to reach a second switch value 68, then the glitch protection to normal condition is met. The switch module 32 switches the phase/frequency detecting device 12 from the glitch protection mode to the normal mode. In FIG. 8, the left side of the switch point 73 represents that the phase/frequency detecting device 12 is under the glitch protection mode, and the right side of the switch point 73 represents that the phase/frequency detecting device 12 is under the normal mode; M represents the second switch value 68, and M−5, M−4 . . . M−1 are the count values 66 prior to M.

When the phase/frequency detecting device 12 is under the glitch protection mode, and it still cannot quickly synchronize the target clock signal 20 with the reference clock signal 22 after the reset module 30 continuously resets the phase/frequency detecting device 12 for several times, and when the glitch protection to normal condition is met, the switch module 32 stops outputting the glitch protection mode enable signal 69 for switching the phase/frequency detecting device 12 from the glitch protection mode to the normal mode; thus, the target clock signal 20 and the reference clock signal 22 can be synchronized quickly.

As shown in FIG. 3, the feedback control circuit 18 comprises a charge pump 40, a voltage-controlled oscillator 42, and a divider 44. The charge pump 40 is used for receiving the set of control signals 26, 28 outputted from the phase/frequency detecting device 12 and outputting a control voltage 46. The voltage-controlled oscillator 42 is used for generating a corresponding data clock 48 according to the control voltage 46. The divider 44 is used for dividing the frequency of the data clock 48 by a predetermined divisor and then generating the target clock signal 20.

The counter clock 70 used by the first counter 58 and the second counter 60 can be the data clock 48 generated by the voltage-controlled oscillator 42 or clock signals from other sources. In FIG. 3, a dotted line 77 shows that the source of the counter clock 70 can be the data clock 48 generated by the voltage-controlled oscillator 42 or clock signals from other sources. The frequency of the data clock signals 48 or the other source clock signal is higher than the first control signal 26 and the second control signal 28, so as to count the width of the leading pulse 54 and the lag pulse 56.

Figure 9:
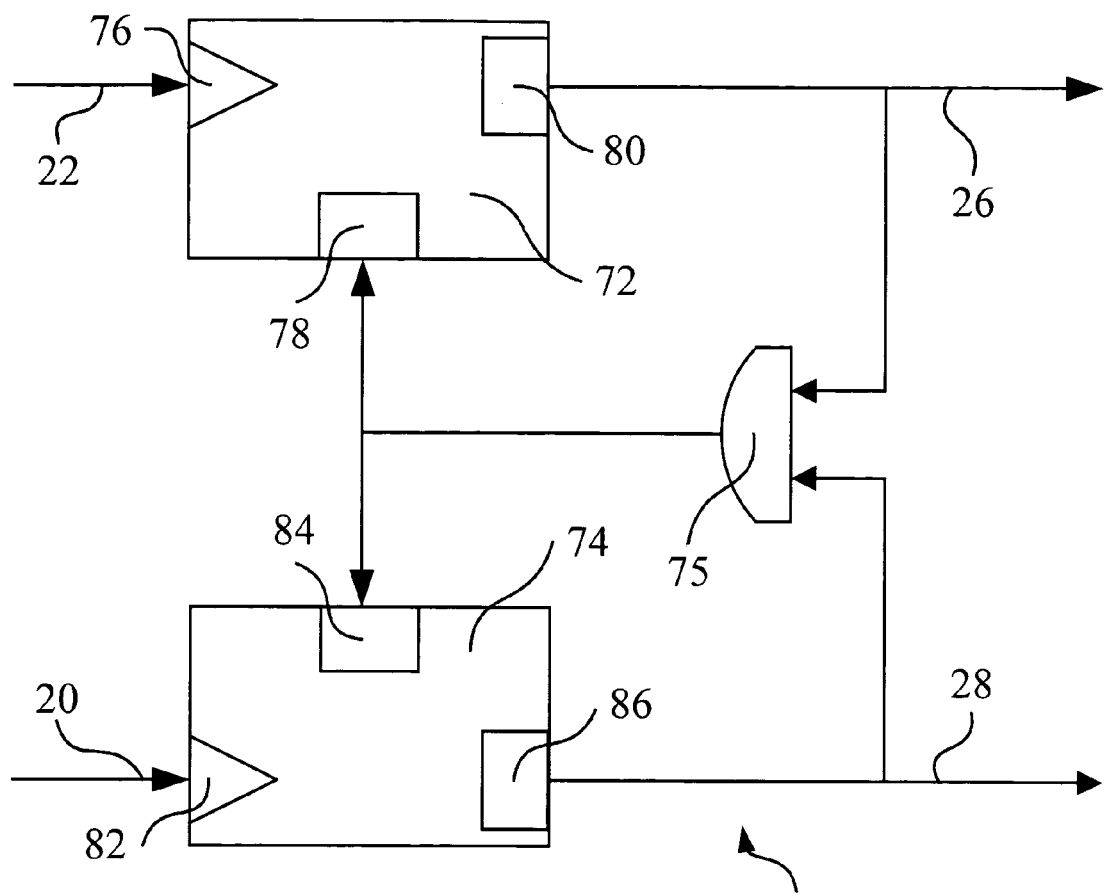
FIG. 9 is a schematic diagram of the phase/frequency detecting device shown in FIG. 3.

Referring to FIG. 9, FIG. 9 is a schematic diagram of the phase/frequency detecting device 12 shown in FIG. 3. The phase/frequency detecting device 12 comprises a first flip flop 72, a second flip flop 74, and an AND gate 75. The first flip flop 72 comprises a first input port 76, a first output port 80, and a first reset port 78. The first flip flop 72 receives the reference clock signal 22 from the first input port 76 and outputs the first control signal 26 from the first output port 80. The second flip flop 74 comprises a second input port 82, a second output port 86, and a second reset port 84. The second flip flop 74 receives the target clock signal 20 from the second input port 82 and outputs the second control signal 28 from the second output port 86. The AND gate 75 is used for receiving the output results from the first output port 80 and the second output port 86 and sending the output results to the first reset port 78 and the second reset port 84.

Referring to FIG. 10A and FIG. 10B, FIG. 10A and FIG. 10B are time-sequence diagrams of the control signals 26, 28 according to another embodiment of the present invention. In these figures, the horizontal axis represents the time, and the vertical axis represents the signal amplitude.

According to the generating method of the control signals 26, 28 in another embodiment, the target clock signal 20 and the reference clock signal 22 both comprise a plurality of square pulses 49, and each of the square pulses 49 comprises a positive edge 50 and a negative edge 52. Comparing to FIG. 4A and FIG. 4B, the generating method of the control signals 26, 28 in FIG. 4A and FIG. 4B is taking the positive edge 50 of the square pulses 49 as the reference index, but in this embodiment in FIG. 10A and FIG. 10B, the generating method of the control signals 26, 28 is taking the negative edge 52 of the square pulses 49 as the reference index. When the negative edge 52a of the reference clock signal 22 is ahead of the negative edge 52b of the neighboring target clock signal 20, the first control signal 26 generates a leading pulse 54 in response to the phase difference between the reference clock signal 22 and the target clock signal 20 (shown in FIG. 10A). When the negative edge 52a of the reference clock signal 22 falls behind the negative edge 52c of the neighboring target clock signal 20, the second control signal 28 generates a lag pulse 56 in response to the phase difference between the reference clock signal 22 and the target clock signal 20 (shown in FIG. 10B). The phase difference between the reference clock signal 22 and the target clock signal 20 is proportional to the width of the leading pulse. FIG. 10A represents that the negative edge 52a of the reference clock signal 22 is ahead of the negative edge 52b of the neighboring target clock signal 20, and FIG. 10B represents that the negative edge 52a of the reference clock signal 22 falls behind the negative edge 52c of the neighboring target clock signal 20.

Figure 11:
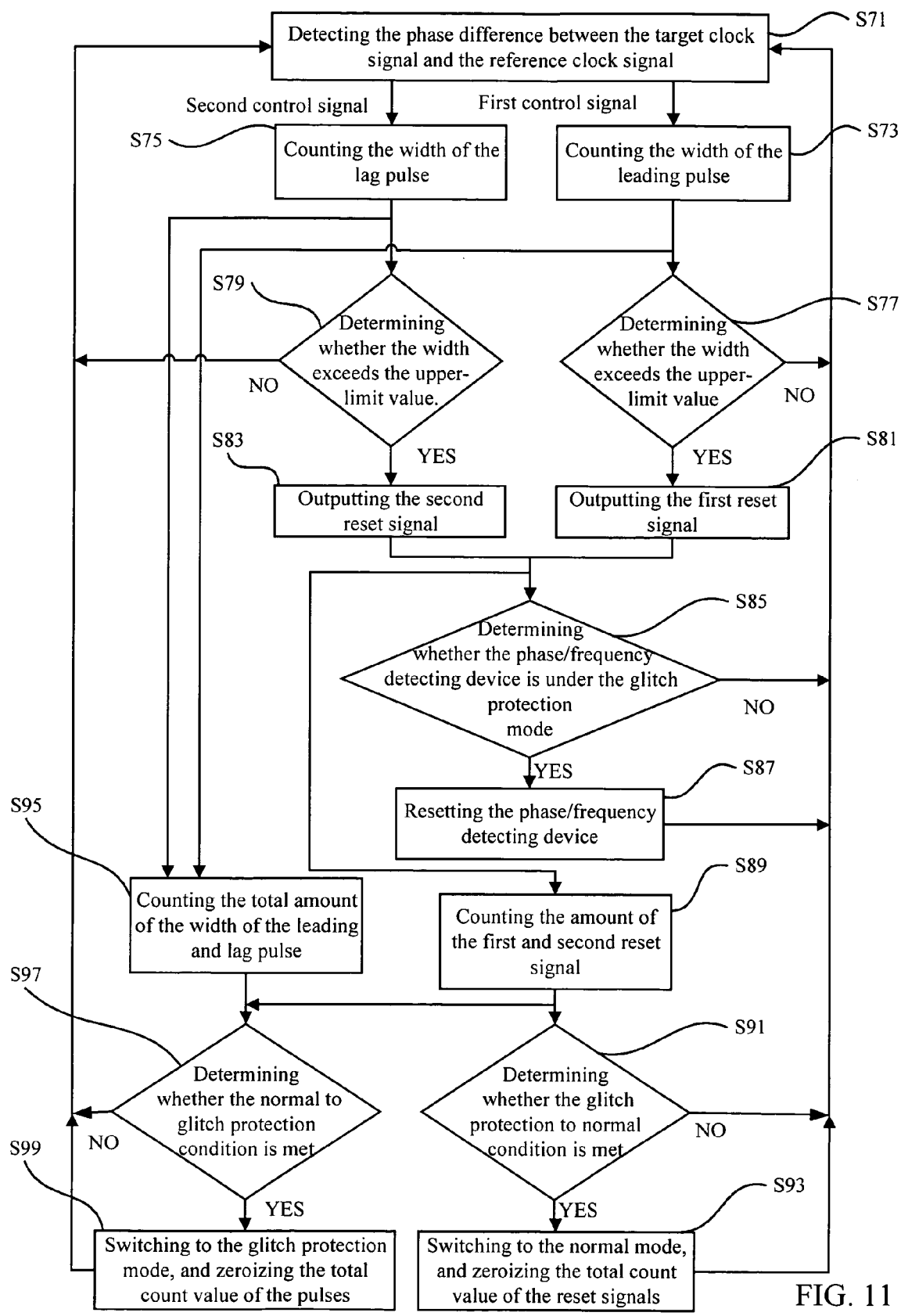
FIG. 11 is a flow chart of the adjustment system according to the present invention.

Referring to FIG. 11, FIG. 11 is a flow chart of the adjustment system according to the present invention. The adjustment method of the adjustment system 14 (shown in FIG. 3) according to the present invention comprises the following steps:

Step S71: By the phase/frequency detecting device 12 of the phase locked loop 11, compare the target clock signal 20, which is generated from the phase locked loop 11, with the predetermined reference clock signal 22 and output the first control signal 26 and the second control signal 28.

Step S73: Count the width of the leading pulse 54 of the first control signal 26 by the counter clock 70.

Step S75: Count the width of the lag pulse 56 of the second control signal 28 by the counter clock 70.

Step S77: Determine whether the width of the leading pulse 54 exceeds the leading upper-limit value.

Step S79: Determine whether the width of the lag pulse 56 exceeds the lag upper-limit value.

Step S81: If the determining result is yes in step S77, then generate the first reset signal 63.

Step S83: If the determining result is yes in step S79, then generate the second reset signal 64.

Step S85: Determine whether the phase/frequency detecting device 12 is under the glitch protection mode.

Step S87: If yes in step S85, then reset the phase/frequency detecting device 12, and set the total count value 65 of the width of the leading pulse 54 and the lag pulse 56 as zero.

Step S89: Count the total count value of the first reset signal 63 and the second reset signal 64.

Step S91: Determine whether the glitch protection to normal condition is met.

Step S93: If yes in step S91, then switch the phase/frequency detecting device 12 form the glitch protection mode to the normal mode by the switch module 32, and set the total count value 66 of the first reset signal 63 and the second reset signal 64 as zero.

Step S95: Count the total number of the width of the leading pulse 54 and the lag pulse 56.

Step S97: Determine whether the normal to glitch protection condition is met.

Step S99: If yes in step S97, then switch the phase/frequency detecting device 12 from the normal mode to the glitch protection mode by the switch module 32, and set the total count value 65 of the width of the leading pulse 54 and the lag pulse 56 as zero.

Comparing to the conventional phase locked loop 10, because of the influence of the glitch 16, the phase/frequency detecting device 12 in the conventional phase locked loop 10 takes more time to cope with the glitch 16; therefore, the operating efficiency of the phase/frequency detecting device 12 is decreased.

According to the adjustment system 14 of the present invention, when the phase/frequency detecting device 12 is under the glitch protection mode, no matter the glitches 16, 17, 19, 21 occur in the target clock signal 20 or the reference clock signal 22 or both, the control signals 26, 28 disturbed by the glitches 16, 17, 19, 21 are forced to be set back to zero because the reset signals 63, 64 reset the phase/frequency detecting device 12. Therefore, the influence on the control signals 26, 28 and the feedback control circuit 18 caused by the glitches 16, 17, 19, 21 is minimized, and the influence of the target clock signal 20 caused by the glitches 16, 17, 19, 21 is also minimized. Therefore, the disadvantage of low operating efficiency of the phase/frequency detecting device 12, which is caused by disturbance in the phase locked loop 10, 11 by the glitches 16, 17, 19, 21, is overcome, and the time being taken to synchronize the target clock signal 20 with the reference clock signal 22 is shortened. Therefore, the target clock signal 20 and the reference clock signal 22 can be synchronized quickly, and the operating efficiency of the phase locked loop 11 can be enhanced.

The adjustment system 14 of the present invention can switch the phase/frequency detecting device 12 between the normal mode and the glitch protection mode, according to different situation, and reset the phase/frequency detecting device 12 at the right moment. Therefore, it can reduce the time being taken to synchronize the target clock signal 20 with the reference clock signal 22.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An adjustment system for adjusting a phase/frequency detecting device in a phase locked loop, the phase/frequency detecting device comparing a target clock signal which is generated from the phase locked loop with a predetermined reference clock signal, and outputting a set of control signals to further control the target clock signal to synchronize with the reference clock signal, the set of control signals comprising a first control signal and a second control signal, the adjustment system comprising:

a) a reset module comprising:

I) a first counter for counting the width of a leading pulse in the first control signal based on a counter clock, and generating a first reset signal when a first reset condition is met; and ii) a second counter for counting the width of a lag pulse in the second control signal based on the counter clock, and generating a second reset signal when a second reset condition is met;

wherein the reset module outputs the first reset signal and the second reset signal when a predetermined reset condition is met; and b) a switch module for counting the first reset signal and the second reset signal outputted by the reset module, and switching the phase/frequency detecting device between a normal mode and a glitch protection mode when a predetermined switch condition is met;

wherein, when the phase/frequency detecting device is under the glitch protection mode, and the predetermined reset condition set by the reset module is met, the reset module outputs the first reset signal and the second reset signal and then resets the phase/frequency detecting device.

2. The adjustment system of claim 1, wherein, when the reference clock signal or the target clock signal generates a glitch, the set of control signals generate an abnormal pulse correspondingly, and when the phase/frequency detecting device is reset, the abnormal pulse in the set of control signals is also minimized so as to reduce the glitch disturbance to the set of control signals.

3. The adjustment system of claim 1, wherein the target clock signal and the reference clock signal both comprise a plurality of square pulses, and each of the square pulses comprises a positive edge and a negative edge.

4. The adjustment system of claim 3, wherein when the positive edge of the reference clock signal is ahead of the positive edge of the neighboring target clock signal, the leading pulse is generated in the first control signal in response to the phase difference between the reference clock signal and the target clock signal, and when the positive edge of the reference clock signal falls behind the positive edge of the neighboring target clock signal, the lag pulse is generated in the second control signal in response to the phase difference between the reference clock signal and the target clock signal.

5. The adjustment system of claim 1, wherein the phase difference between the reference clock signal and the target clock signal is proportional to the width of the leading pulse.

6. The adjustment system of claim 1, wherein the phase difference between the target clock signal and the reference clock signal is proportional to the width of the lag pulse.

7. The adjustment system of claim 1, wherein the first counter generates the first reset signal when the width of the leading pulse exceeds a leading upper-limit value and the second counter generates the second reset signal when the width of the lag pulse exceeds a lag upper-limit value.

8. The adjustment system of claim 1, wherein the predetermined reset condition is met by the generation of the first reset signal, the second reset signal, or both of them.

9. The adjustment system of claim 1, wherein the predetermined switch condition comprises a normal to glitch protection condition, the normal to glitch protection condition being as follows:

if not even one of the first reset signal or the second reset signal is generated during the whole process when the total amount of the width of the leading pulse in the first control signal counted by the first counter and the width of the lag pulse in the second control signal counted by the second counter reaches a first switch value, the switch module switches the phase/frequency detecting device from the normal mode to the glitch protection mode.

10. The adjustment system of claim 1, wherein the predetermined switch condition comprises a glitch protection to normal condition, the glitch protection to normal condition being as follows:

when the total number of the continuously generated first and second reset signals is counted to reach a second switch value, the switch module switches the phase/frequency detecting device from the glitch protection mode to the normal mode.

11. The adjustment system of claim 1, wherein the phase locked loop further comprises a feedback control circuit for generating the target clock signal, the feedback control circuit comprising:

a) a charge pump, for receiving the set of control signals outputted from the phase/frequency detecting device, and outputting a control voltage;

b) a voltage-controlled oscillator, for generating a corresponding data clock according to the control voltage; and c) a divider, for dividing the frequency of the data clock by a predetermined divisor, and then generating the target clock signal.

12. The adjustment system of claim 11, wherein the count clock used by the first counter and the second counter is the data clock generated by the voltage-controlled oscillator, and the frequency of the data clock is higher than the first control signal and the second control signal, so as to count the width of the leading pulse and the lag pulse.

13. The adjustment system of claim 1, wherein the phase/frequency detecting device comprises:

a) a first flip flop, comprising a first input port, a first output port, and a first reset port, wherein the first flip flop receives the reference clock signal from the first input port, and outputs the leading pulse via the first output port;

b) a second flip flop, comprising a second input port, a second output port, and a second reset port, wherein the second flip flop receives the target clock signal from the second input port, and outputs the lag pulse via the second output port; and c) an AND gate for receiving the output results from the first output port and the second output port, performing AND operation, and sending the output results to the first reset port and the second reset port.

14. An adjustment method for adjusting a phase/frequency detecting device in a phase locked loop, the phase/frequency detecting device comparing a target clock signal which is generated from the phase locked loop with a predetermined reference clock signal, and outputting a set of control signals to further control the target clock signal to synchronize with the reference clock signal, the set of control signals comprising a first control signal and a second control signal, the adjustment method comprising:

a) counting the width of a leading pulse in the first control signal based on a counter clock, and generating a first reset signal when a first reset condition is met;

b) counting the width of a lag pulse in the second control signal based on the counter clock, and generating a second reset signal when a second reset condition is met;

c) outputting the first reset signal and the second reset signal when a predetermined reset condition is met; and d) counting the outputted first reset signal and second reset signal and switching the phase/frequency detecting device between a normal mode and a glitch protection mode when a predetermined switch condition is met;

wherein, when the phase/frequency detecting device is under the glitch protection mode, and the predetermined reset condition is met, the first reset signal and the second reset signal are outputted and the phase/frequency detecting device is then reset.

15. The adjustment method of claim 14, wherein the target clock signal and the reference clock signal both comprise a plurality of square pulses, and each of the square pulses comprises a positive edge and a negative edge.

16. The adjustment method of claim 15, wherein when the positive edge of the reference clock signal is ahead of the positive edge of the neighboring target clock signal, the leading pulse is generated in the first control signal in responsive to the phase difference between the reference clock signal and the target clock signal, and wherein when the positive edge of the reference clock signal falls behind the positive edge of the neighboring target clock signal, the lag pulse is generated in the second control signal in responsive to the phase difference between the reference clock signal and the target clock signal.

17. The adjustment method of claim 14, wherein the first counter generates the first reset signal when the width of the leading pulse exceeds a leading upper-limit value and the second counter generates the second reset signal when the width of the lag pulse exceeds a lag upper-limit value.

18. The adjustment method of claim 14, wherein, the predetermined reset condition is met by the generation of the first reset signal, or the second reset signal, or both of them.

19. The adjustment method of claim 14, wherein the predetermined switch condition comprises a normal to glitch protection condition, the normal to glitch protection condition being as follows:

if not even one of the first reset signal or the second reset signal is generated during the whole process when the total amount of the width of the leading pulse in the first control signal counted by the first counter and the width of the lag pulse in the second control signal counted by the second counter reaches a first switch value, the phase/frequency detecting device is switched from the normal mode to the glitch protection mode.

20. The adjustment method of claim 14, wherein the predetermined switch condition comprises a glitch protection to normal condition, the glitch protection to normal condition being as follows:

when the total amount of the continuously generated first and second reset signals is counted to reach a second switch value, the phase/frequency detecting device is switched from the glitch protection mode to the normal mode.

* * * * *